(12) United States Patent
Ito

(10) Patent No.: US 6,723,482 B2
(45) Date of Patent: Apr. 20, 2004

(54) HEAT-SENSITIVE RECORDING MATERIAL

(75) Inventor: Koreshige Ito, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/166,730

(22) Filed: Jun. 12, 2002

(65) Prior Publication Data

US 2003/0022092 A1 Jan. 30, 2003

(30) Foreign Application Priority Data

Jun. 13, 2001 (JP) ........................................ 2001-178739

(51) Int. Cl.$^7$ ............................................... G03F 7/021
(52) U.S. Cl. ...................... 430/138; 430/157; 430/171; 430/172
(58) Field of Search ................................ 430/138, 157, 430/171, 172

(56) References Cited

U.S. PATENT DOCUMENTS

| | | | |
|---|---|---|---|
| 5,486,446 A | * | 1/1996 | Matushita et al. ........... 430/156 |
| 6,248,497 B1 | * | 6/2001 | Sano et al. .................. 430/138 |
| 6,329,116 B1 | * | 12/2001 | Sato et al. .................. 430/138 |

FOREIGN PATENT DOCUMENTS

| JP | 4-59287 | 2/1992 |
|---|---|---|
| JP | 7-96671 | 4/1995 |

* cited by examiner

Primary Examiner—John S. Chu
(74) Attorney, Agent, or Firm—Sughrue Mion, PLLC

(57) ABSTRACT

The present invention provides a heat-sensitive recording material comprising a substrate having disposed thereon at least a heat-sensitive recording layer comprising: microcapsules; diazonium salt compounds contained within the microcapules and represented by the following general formula (I); and a coupler which undergoes coupling-reaction with the diazonium salt compounds to cause color development, wherein three or more of the diazonium salt compounds represented by the general formula (I) are contained in the same microcapsule:

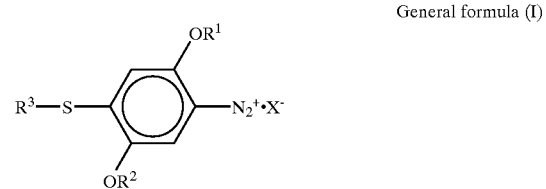

General formula (I)

(wherein $R^1$, $R^2$ and $R^3$ each independently represents an alkyl group, a substituted alkyl group, an aryl group or a substituted aryl group; and $X^-$ represents a counter anion).

15 Claims, No Drawings

HEAT-SENSITIVE RECORDING MATERIAL

BACKGROUND OF THE INVENTION

1. Field of the Invention

The present invention relates to a heat-sensitive recording material, more particularly to a diazo compound-based heat-sensitive recording material which can be fixed and which is excellent in preservability.

2. Description of the Related Art

Heat-sensitive recording materials for recording images by applying heat via a thermal head or the like are widely used since they are relatively cheap, a recording apparatus for use therewith is simple and highly reliable, and maintenance thereof is unnecessary. Under such conditions, there has recently been strong desire for high performance such as high image quality, improved preservation stability and the like, and studies of color developing density, image quality, preservability and other properties of heat-sensitive materials have been intensively conducted.

As heat-sensitive recording materials, those using a diazo compound as a color component for improving color developing density, image quality and preservability have been abundantly developed. In the case of the heat-sensitive recording materials containing diazo compound, an image is formed by heat, then, the diazo compound is thermally decomposed (fixed) with light, and image preservability can be significantly improved by encapsulating the diazo compound.

However, even with the above-mentioned heat-sensitive recording materials containing the diazo compound, a problem is observed in that, after printing an image, a color developed portion thereof becomes discolored over time during storage and image concentration decreases. This has been ascribed to crystallization of an azo dye in the color developed portion with the passage of time. To prevent discoloration of the image resulting from crystallization of this dye, a diazo compound which is not easily crystallized when an azo dye is formed can be effectively used. When the diazo compound which is not easily crystallized is used, however, a problem occurs in that there is a decrease in light resistance of the color developed portion.

SUMMARY OF THE INVENTION

An object of the present invention is to solve the above-described problems of the prior art and specifically to provide a heat-sensitive recording material which suppresses discoloration over time without decreasing light resistance of a color developed portion and which has excellent image preservability.

A first aspect of the present invention provides a heat-sensitive recording material comprising a substrate having disposed thereon at least a heat-sensitive recording layer comprising:
  microcapsules;
  diazonium salt compounds contained within the microcapules and represented by the following general formula (I); and
  a coupler which undergoes coupling-reaction with the diazonium salt compounds to cause color development,
  wherein three or more of the diazonium salt compounds represented by the general formula (I) are contained in the same microcapsule:

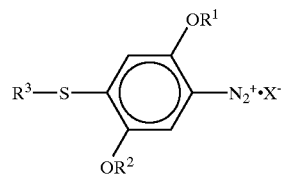

General formula (I)

(wherein $R^1$, $R^2$ and $R^3$ each independently represents an alkyl group, a substituted alkyl group, an aryl group or a substituted aryl group; and $X^-$ represents a counter anion).

Further, a second aspect of the present invention provides the heat-sensitive recording material of the first aspect at least one of said diazonium salt compounds contained in the microcapsule is a compound represented by the following general formula (II):

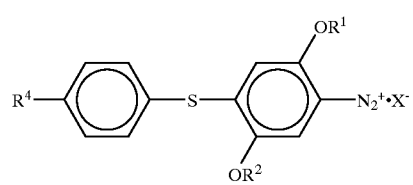

General formula (II)

(wherein $R^1$ and $R^2$ each independently represents an alkyl group, a substituted alkyl group, an aryl group or a substituted aryl group; $R^4$ represents an alkyl group; and $X^-$ represents a counter anion).

DETAILED DESCRIPTION OF THE INVENTION

A heat-sensitive recording material of the present invention will now be described in detail.

The heat-sensitive recording material of the present invention comprises a substrate having disposed thereon at least a heat-sensitive recording layer containing diazonium salt compounds represented by the general formula (I) listed below and a coupler which undergoes coupling reaction with the diazonium salt compound to cause color development, wherein three or more diazonium salt compounds represented by the general formula (I) are contained in the same microcapsule.

In the heat-sensitive recording material of the present invention, crystallization of an azo dye with the passage of time can be suppressed without decreasing light resistance, by allowing three or more diazonium salt compounds represented by the general formula (I) to be contained in the same microcapsule. As a result, discoloration of a color developed portion can be suppressed to improved image preservability. In the heat-sensitive recording material of the present invention, it is necessary that three or more diazonium salt compounds represented by the following general formula (I) are contained in the same microcapsule. Said diazonium salt compounds may be appropriately selected and a number of kinds contained determined so that each diazonium salt compound is contained in an amount of at least 5% by weight. From the standpoint of balancing cost performance and the like with the effect of the invention, however, three or four diazonium salt compounds are preferably contained.

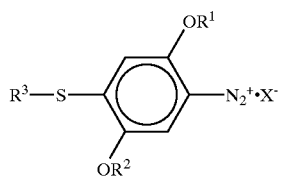

General formula (I)

The heat-sensitive recording material of the invention has at least the heat sensitive recording layer disposed on the substrate, and the heat sensitive recording layer may comprise a single layer or a plurality of layers, and, if necessary, other layers such as a light transmittance controlling layer, a protective layer and the like may further be provided.

Heat-Sensitive Recording Layer

The heat-sensitive recording material of the invention has at least the one heat sensitive recording layer containing microcapsules containing three or more diazonium salt compounds of the above-mentioned general formula (I).

In the above-mentioned general formula (I), $R^1$, $R^2$ and $R^3$ each independently represents an alkyl group, a substituted alkyl group, an aryl group or a substituted aryl group. A total number of carbon atoms in $R^1$, $R^2$ and $R^3$ is preferably 12 or more, and more preferably 14 or more.

Examples of the alkyl group include a methyl group, ethyl group, a propyl group, an isopropyl group, a butyl group, a sec-butyl group, a t-butyl group, a pentyl group, an isopentyl group, a cyclopentyl group, a hexyl group, a cyclohexyl group, an octyl group, a t-octyl group, a 2-ethylhexyl group, a nonyl group, an octadecyl group and the like.

Examples of the substituent of the substituted alkyl group include alkoxy groups, alkoxycarbonyl groups, alkylsulfonyl groups, substituted amino group, substituted amide groups, aryl groups, aryloxy groups, halogen and the like. However, the scope of the invention is not limited thereto. Specific examples of the substituted alkyl group include a benzyl group, 4-methoxybenzyl group, triphenylmethyl group, ethoxycarbonylmethyl group, 2-ethylhexyloxycarbonylmethyl group, methoxyethyl group, ethoxyethyl group, butoxyethyl group, 2',4'-diisopentylphenyloxymethyl group, 2',4'-di-t-butylphenyloxymethyl group, dibenzylaminocarbonylmethyl group, 2,4-di-t-aminophenyloxypropyl group, ethoxycarbonylpropyl group, 1-(2',4'-di-t-aminophenyloxy)propyl group, acetylaminoethyl group, 2-(N,N-dimethylamino)ethyl group, 2-(N,N-dimethylamino)propyl group, methanesulfonylaminopropyl group and the like.

Examples of the substituent of the substituted aryl group include, but are not limited to, alkyl groups, alkoxy groups, alkylthio groups, aryl groups, aryloxy groups, arylthio groups, acyl groups, alkoxycarbonyl groups, carbamoyl groups, carboamide groups, sulfonyl groups, sulfamoyl groups, sulfoneamide groups, ureide groups, amino groups, heterocyclic groups, halogens and the like.

Specific examples of the substituted aryl group include a 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy)phenyl group, 4-chlorophenyl group, 4-methylphenyl group, 4-methoxyphenyl group, 4-butoxyphenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl)phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, 4-(N-benzyl-N-methylamino)-2-dodecyloxycarbonylphenyl group and the like.

The alkyl group, the substituted alkyl group, the aryl group and the substituted aryl group may be further substituted, and substituents thereof include alkyl groups, aryl groups, hydroxyl groups, alkyloxy groups, alkylthio groups, arylthio groups, acyl groups, alkoxycarbonyl groups, acyloxy groups, carbamoyl groups, acylamino groups, halogen atoms, cyano group and the like.

$X^-$ in the general formula (I) represents a counter anion. Examples of the counter anion include polyfluoroalkylcarboxylic acids, polyfluoroalkylsulfonic acids, boron tetrafluoride, tetraphenylboric acids, hexafluorophosphoric acids, aromatic carboxylic acids, and aromatic sulfonic acids, and among these, hexafluorophosphotic acids are preferable.

From the standpoint of sufficient control of crystallization of an azo dye, it is preferable that at least one of the three or more diazonium salt compounds represented by the general formula (I) contained in the same microcapsule is a diazonium salt compound represented by the following general formula (II).

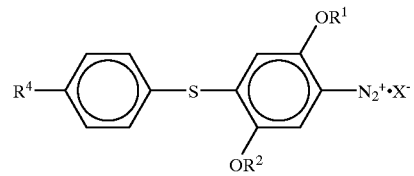

General formula (II)

The diazonium salt compound represented by the general formula (II) is a compound represented by the general formula (I) in which $R^3$ is substituted by an aryl group substituted with an alkyl group, and $R^1$, $R^2$ and $X^-$ are the same as $R^1$, $R^2$ and $X^-$ in the general formula (I), and descriptions thereof are therefore omitted. In the general formula (II), $R^4$ represents an alkyl group, and examples of this alkyl group include a methyl group, an ethyl group, a propyl group, an isopropyl group, a butyl group, a sec-butyl group, a t-butyl group, a pentyl group, an isopentyl group, a cyclopentyl group, a hexyl group, a cyclohexyl group, an octyl group, a t-octyl group, a 2-ethylhexyl group, a nonyl group, an octadecyl group and the like. Among these a methyl group and ethyl group are preferable, and a methyl group is particularly preferable.

Specific examples of the diazonium salt compounds represented by the general formulae (I) and (II) are listed below (exemplary compounds (1) to (16)), but the scope of the invention is not limited thereto.

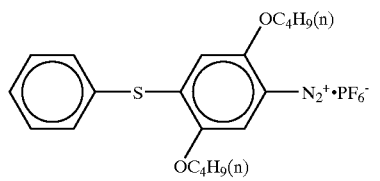 (1)
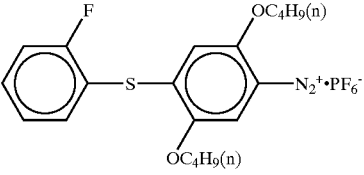 (9)
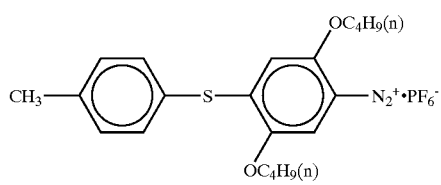 (2)
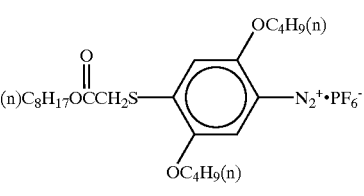 (10)
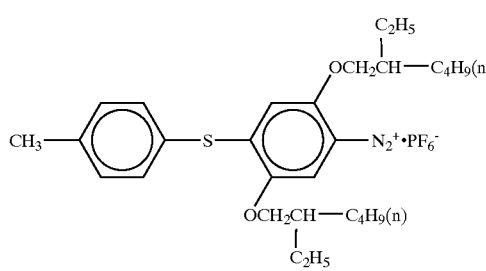 (3)
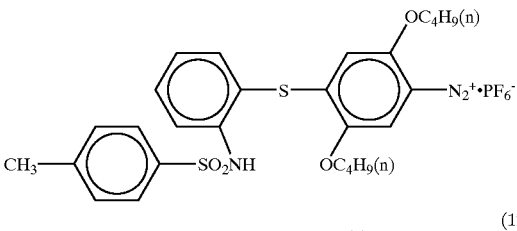 (11)
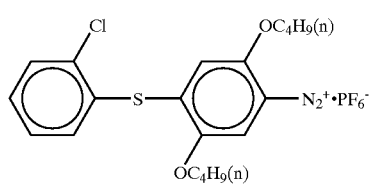 (4)
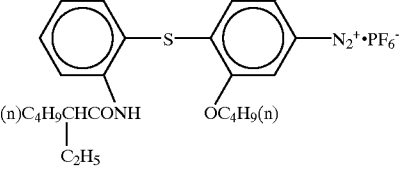 (12)
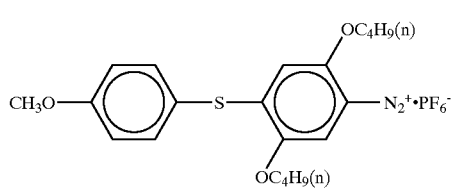 (5)
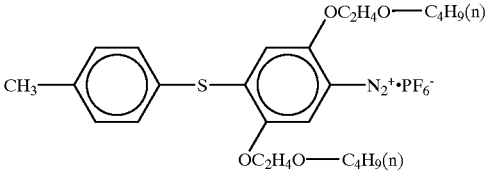 (13)
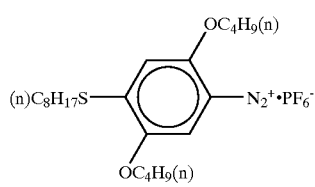 (6)
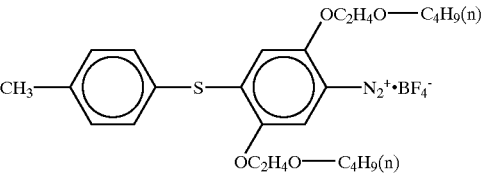 (14)
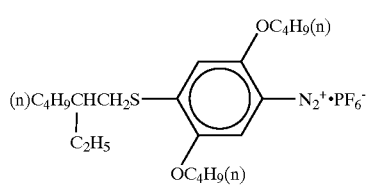 (7)
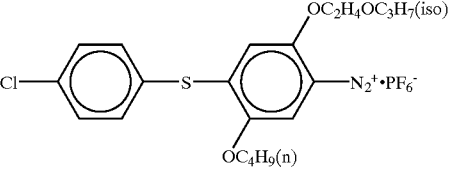 (15)
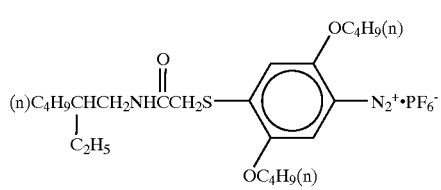 (8)
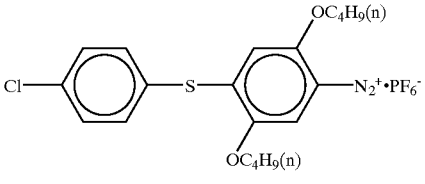 (16)

Among the diazonium salt compounds represented by the general formulae (I) and (II), those having a melting point in a range of from 30° C. to 200° C. are preferable. When the diazonium salt compounds represented by the general formulae (I) and (II) are contained in microcapsules, they are dissolved in a suitable solvent (for example, tricresyl phosphate, ethyl acetate or the like) before use, and those having suitable solubility in these solvents (for example, 5% by weight or more) are therefore preferable. Each of the diazonium salt compounds represented by the general formulae (I) and (II) preferably has a solubility of 1% by weight or less.

The three or more diazonium salt compounds represented by the general formula (I) used in the invention are used in the heat-sensitive recording layer in a total amount of preferably from 0.02 to 3 g/m², and, from a standpoint of color developing density, particularly preferably from 0.1 to 2 g/m². Though a content of each diazonium salt compound, which is based on a total content of all of the diazonium salt compounds, is also determined by the number and properties of the diazonium salt compounds contained in the same microcapsule, if the content of each diazonium salt compound is too small, crystallization suppressing effect may decrease and light resistance may be lowered. Therefore, the content of each diazonium salt compound is preferably at least 5% by weight or more, and further preferably 10% by weight or more. For example, when three of the above-mentioned diazonium salt compounds are used together, it is preferable that each compound is contained in an amount of 15% by weight or more, and further preferably in an amount of 20% by weight or more. When four of the above-mentioned diazonium salt compounds are used together, it is preferable that each compound is contained in an amount of 10% by weight or more, and further preferably in an amount of 15% by weight or more.

When the diazonium salt compound represented by the general formula (II) is used, it is preferable to use in combination therewith a diazonium salt compound represented by the general formula (I) which shows high light resistance when an azo dye is produced. Examples of the diazonium salt compound represented by the general formula (I) which show high light resistance when used to form an azo dye include the above-mentioned exemplary compounds (1), (15) and (16). When the diazonium salt compound represented by the general formula (II) and other diazonium salt compound represented by the general formula (I) are used together, a content of the diazonium salt compound represented by the general formula (II) is preferably from 20 to 50% by weight, and further preferably from 25 to 40% by weight based on a total amount of the three diazonium salt compounds represented by the above-mentioned general formula (I), for compatibility of light resistance of a color developed portion and image preservability.

In the heat-sensitive recording material of the invention, at least one heat sensitive recording layer containing microcapsules containing three or more diazonium salt compounds represented by the general formula (I) may be disposed on a substrate, and additional layers may also be included. The heat-sensitive recording material of the invention may have a laminated construction comprising a heat sensitive recording layer containing a known diazo compound as a color developing component and a coupler, or an electron-donating colorless dye and an electron-accepting compound, and the heat sensitive recording layer of the invention.

Examples of the known diazo compound include diazonium salt compounds represented the following general formula (III):

(wherein Ar represents a substituted or unsubstituted aryl group, and $X^{1-}$ represents an acid anion).

The diazonium salt compound represented by the general formula (III) causes a coupling reaction with a later-described coupler by heating, and causes decomposition by light. A maximum absorption wavelength thereof can be controlled by position and kind of a substituent for Ar.

In the general formula (III), Ar represents a substituted or unsubstituted aryl group.

As the aryl group represented by Ar, aryl groups having 6 to 30 carbon atoms are preferable, and examples thereof include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenylgroup, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibromoaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, 4-(N-benzyl-N-methylamino)-2-dodecyloxycarbonylphenyl group and the like. These groups may be substituted by an alkyl group, alkoxy group, alkylthio group, aryl group, aryloxy group, arylthio group, acyl group, alkoxycarbonyl group, carbamoyl group, carboamide group, sulfonyl group, sulfamoyl group, alkyloxy group, cyano group, amino group, substituted amino group, halogen atom, heterocyclic group, sulfoneamide group, ureide group, halogen group, heterocyclic group and the like, and these may be further substituted.

Specific examples of the diazonium used to form the diazonium salt represented by the general formula (III) include 4-(p-tolylthio)-2,5-dibutoxybenzenediazonium, 4-(4-chlorophenylthio)-2,5-dibutoxybenzenediazonium, 4-(N,N-dimethylamino)benzenediazonium, 4-(N,N-diethylamino)benzenediazonium, 4-(N,N-dipropylamino) benzenediazonium, 4-(N-methyl-N-benzylamino) benzenediazonium, 4-(N,N-dibenzylamino) benzenediazonium, 4-(N-ethyl-N-hydroxyethyamino) benzenediazonium, 4-(N,N-diethylamino)-3-methoxybenzenediazonium, 4-(N,N-dimethylamino)-2-methoxybenzenediazonium, 4-(N-benzoylamino)-2,5-diethoxybenzenediazonium, 4-morpholino-2,5-dibutoxybenzenediazonium, 4-anilinobenzenediazonium, 4-[N-(4-methoxybenzoyl)amino]-2,5-diethoxybenzendiazonium, 4-pyrrolino-3-ethylbenzenediazonium, 4-[N-(1-methyl-2-(4-methoxyphenoxy)ethyl)-N-hexylamino]-2-hexyloxybenzenediazonium, 4-[N-(2-(4-methoxyphenoxy) ethyl)-N-hexylamino]-2-hexyloxybenzenediazonium, 2-(1-ethylpropyloxy)-4-[di-(di-n-butylaminocarbonylmethyl) amino]benzenediazonium, 2-benzylsulfonyl-4-[N-methyl-N-(2-octanoyloxyethyl)]aminobenzenediazonium and the like.

In the general formula (III), $X^{1-}$ represents and acid anion, and examples thereof include polyfluoroalkylcarboxylic acids having 1 to 9 carbon atoms, polyfluoroalkylsulfonic acids having 1 to 9 carbon atoms, boron tetrafluoride, tetraphenylboric acid, hexafluorophosphoric acid, aromatic carboxylic acids, aromatic sulfonic acids and the like. Among these, hexafluorophosphoric acids are preferable from a standpoint of crystallinity.

The maximum absorption wavelength $\lambda_{max}$ of the above-mentioned known diazo compound may be appropriately selected depending on conditions of the layer in which it is used and the like, but it is preferably 450 nm or less, and more preferably from 290 to 440 nm. When the maximum absorption wavelength $\lambda_{max}$ exceeds 450 nm, preservability may be reduced, and when it is shorter than the above-mentioned range, image fixing properties and image preservability may decrease and hue may deteriorate depending on a combination with a coupler described below.

It is preferable that the diazonium salt compound of the present invention has 12 or more carbon atoms, has a solubility in water of 1% by weight or less, and a solubility in ethyl acetate of 5% by weight or more.

The diazonium salt compound may be used alone, or two or more may be used in combination depending on specific objectives such as hue control and the like.

As the coupler to undergo a coupling-reaction with the above-mentioned diazonium salt compound to form a dye for color developing, any compounds may be used that can couple with a diazonium salt compound under a basic atmosphere and/or a neutral atmosphere to form a dye, and they can be appropriately selected within a range corresponding to objectivities such as hue control and the like.

Examples of the coupler include resorcinol, phloroglucin, sodium 2,3-hydroxynaphthalene-6-sulfonate, sodium 2-hydroxy-3-naphthalenesulfonate, 2-hydroxy-3-naphthalenesulfonic anilide, 2-hydroxy-3-naphthalenesulfinic morpholinoamide, 2-hydroxy-3-naphthalenesulfonic morpholinopropylamide, 2-hydroxy-3-naphthalenesulfonic-2-ethylhexyloxypropylamide, 2-hydroxy-3-naphthalenesulfonic-2-ethyhexylamide, sodium 1-hydroxy-8-acetylaminonaphthalene-1,6-disulfonate, 1-hydroxy-8-acetylaminonaphthalene-8,6-disulfonic dianilide, 1-hydroxy-2-naphthoic morpholinopropylamide, 1,3-dihydroxynaphthalene, 2,2-dihydroxynaphthalene, 2,3-dihydroxy-6-naphthalenesulfonic anilide, 2-hydroxy-3-naphthoic morpholinopropylamide, 2-hydroxy-3-naphthoic anilide, 2-hydroxy-3-naphthoic-2'-methylanilide, 2-hydroxy-3-naphthoic ethanolamide, 2-hydroxy-3-naphthoic octylamide, 2-hydroxynaphthoic morpholinoethylamide, 2-hydroxynaphthoic piperidinopropylamide, 2-hydroxynaphthoic piperidinoethylamide, 2-hydroxy-3-naphtoic-N-dodecyl-oxy-propylamide, 2-hydroxy-3-naphthoic tetradecylamide, 6-methoxy-2-hydroxy-3-naphthoic anilide, 6-ethoxy-2-hydroxy-3-naphthoic anilide, 6-methoxy-2-hydroxy-3-naphthoic morpholinopropylamide, 6-methoxy-2-hydroxy-3-naphthoic-2-hydroxyethylamide, acetanilide, acetacetanilide, 2-chloro-3-(2,4-di-1-amylphenoxypropylaminocarbonyl)-pivaloylacetanilide, benzoylacetanilide, 1-phenyl-3-methyl-5-pirazolone, 1-(2',4',6'-trichlorophenyl)-3-benzamide-5-pyrazolone, 1-(2',4',6'-trichlorophenyl)-3-anilino-3-pyrazolone, 1-phenyl-3-phenylacetamide-5-pyrazoline and the like. These couplers may be used alone or in a combination of two or more. A content of the couplers in the heat sensitive recording layer is preferably from 0.1 to 30 parts by weight per 1 part by weight of the diazonium salt compound.

In the heat-sensitive recording material of the invention, a combination of an electron-donating dye precursor and an electron-accepting compound (leuco color developing agent) can also be used, as described above, in addition to a diazo compound and a coupler (diazo color developing agent), as a color developing component. For example, if the heat-sensitive recording material has a plurality of the heat sensitive recording layers on the substrate, at least one layer can contain a leuco color developing agent.

Examples of the electron-donating dye precursor include triarylmethane-based compounds, diphenylmethane-based compounds, thiazine-based compounds, xanthene-based compounds, spiropyrane-based compounds and the like are listed, and among these, triarylmethane-based compounds and xanthene-based compounds are preferable due to high color developing density thereof.

Specific examples thereof include 3,3-bis(p-dimethylaminophenyl)-6-dimethylaminophthalide (namely, crystal violet lactone), 3,3-bis(p-dimethylamino)phthalide, 3-(p-dimethylaminophenyl)-3-(1,3-dimethylindol-3-yl) phthalide, 3-(p-dimethylaminophenyl)-3-(2-methylindol-3-yl)phthalide, 3-(o-methyl-p-diethylaminophenyl)-3-(2-methylindol-3-yl)phthalide, 4,40-bis(dimethylamino) benzhydrinbenzyl ether, N-halophenyl leuco auramine, N-2,4,5-trichlorophenyl leuco auramine, rhodamine-B-anilinolactam, rhodamine(p-nitroanilino) lactam, rhodamine-B-(p-chloroanilino) lactam, 2-benzylamino-6-diethylaminofluorane, 2-anilino-6-diethylaminofluorane, 2-anilino-3-methyl-6-diethylaminofluorane, 2-anilino-3-methyl-6-cyclohexylmethylaminofluorane, 2-anilino-3-methyl-6-isoamylethylaminofluorane, 2-(o-chloroanilino)-6-diethylaminofluorane, 2-octylamino-6-diethylaminofluorane, 2-ethoxyethylamino-3-chloro-2-diethylaminofluorane, 2-anilino-3-chloro-6-diethylaminofluorane, benzoyl leuco methylene blue, p-nitrobenzyl leuco methylene blue, 3-methyl-spiro-dinaphthopyrane, 3-ethyl-2-spiro-dinaphthopyrane, 3,3'-dichloro-spiro-dinaphthopyrane, 3-benzylspirodinaphthopyrane, 3-propyl-spiro-dibenzopyrane and the like.

An amount of the electron-donating dye precursor to be included in the heat sensitive recording layer is preferably from 0.1 to 2 g/m² in light of the same conditions listed previously for the diazonium salt compounds.

Examples of the electron-accepting compound include phenol derivatives, salicylic acid derivatives, hydroxy benzoates and the like, and among these, bisphenols and hydroxy benzoates are preferable.

Specific examples thereof include 2,2-bis(p-hydroxyphenyl)propane (namely, bisphenol A), 4,4'-(p-phenylenediisopropylidene)diphenol (namely, bisphenol P), 2,2-bis(p-hydroxyphenyl)pentane, 2,2-bis(p-hydroxyphenyl)ethane, 2,2-bis(p-hydroxyphenyl)butane, 2,2-bis(4'-hydroxy-3',5'-dichlorophenyl)propane, 1,1-(p-hydroxyphenyl)cyclohexane, 1,1-(p-hydroxyphenyl) propane, 1,1-(p-hydroxyphenyl)pentane, 1,1-(p-hydroxyphenyl)-2-ethylhexane, 3,5-di(α-methylbenzyl) salicylic acid and polyvalent metal salts, 3,5-di(tert-butyl) salicylic acid and polyvalent metal salts, 3-α,α-dimethylbenzylsalicylic acid and polyvalent metal salts, butyl p-hydroxybenzoate, benzyl p-hydroxybenzoate, 2-ethylhexyl p-hydroxybenzoate, p-phenylphenol, p-cumylphenol and the like.

A content of the electron-accepting compound in the heat sensitive recording layer is preferably from 0.1 to 30 parts by weight per 1 part by weight of the electron-donating dye precursor.

An organic base is preferably added to the heat sensitive recording layer of the present invention for the purpose of promoting a coupling reaction between the diazonium salt compound and the coupler.

The organic base is preferably contained together with the diazonium salt compound and the coupler in the heat sensitive recording layer, and may be used alone or in a combination of two or more.

Examples of the organic base include nitrogen-containing compounds such as tertiary amines, pyperidines, pyperazines, amidines, formamidines, pyridines, guanidines, morpholines and the like. Further, those described in Examined Japanese Patent Application Publication (JP-B) Nos. 52-46806, 2-24916 and 2-28479 and Japanese Patent Application Laid-Open (JP-A) Nos. 62-70082, 57-169745, 60-94381, 57-123086, 58-1347901, 60-49991, 60-165288 and 57-185430 can also be used.

Among these, particularly preferable examples include piperazines such as N,N'-bis(3-phenoxy-2-hydroxypropyl) piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, 1,4-bis{[3-(N-methylpiperazino)-2-hydroxy]propyloxy}benzene; morpholines such as N-3-(β-naphthoxy)-2-hydroxy]propylmorpholine, 1,4-bis(3-morpholino-2-hydroxypropyoxy)benzene, 1,3-bis(3-morpholino-2-hydroxypropyoxy)benzene; piperidines such as N-(3-phenoxy-2-hydroxyproyl)piperidine and N-dodecylpiperidine; and guanidines such as triphenylguanidine, trichlohexylguanidine, and dicyclohexylphenylguanidine.

When the organic base is contained in the heat sensitive recording layer, a content thereof is preferably from 0.1 to 30 parts by weight per 1 part by weight of the diazonium salt compound.

In addition to the above-mentioned organic base, a sensitizer can also be added to the heat sensitive recording layer of the heat-sensitive recording material of the invention for the purpose of promoting a color developing reaction.

The above-mentioned sensitizer is a substance which enhances color developing density in heat recording or decreases a minimum color developing temperature, and which makes the diazonium salt, the organic base, the coupler and the like react more easily by lowering a melting point of the coupler, the organic base, the diazonium salt or the like and by decreasing a softening point of capsule walls.

Specifically, organic compounds of low melting points having within molecules thereof aromatic groups and polar groups in suitable amounts are preferable, and examples thereof include benzyl p-benzyoxybenzoate, α-naphthyl benzyl ether, β-naphthyl benzyl ether, phenyl β-naphthoate, phenyl α-hydroxy-β-naphthoate, β-naphthol-(p-chlorobenzyl) ether, 1,4-butanediol phenyl ether, 1,4-butanediol p-methylphenyl ether, 1,4-butanediol p-ethylphenyl ether, 1,4-butanediol m-mehylphenyl ether, 1-phenoxy-2-(p-tolyloxy)ethane, 1-phenoxy-2-(p-ethylphenoxy)ethane, 1-phenoxy-2-(p-chlorophenoxy) ethane, p-benzylbiphenyl and the like.

As a binder used in the heat sensitive recording layer of the invention, known water-soluble polymer compounds, latexes and the like may be used.

Examples of the water-soluble polymer compound include methylcellulose, carboxylmethylcellulose, hydroxyethylcellulose, hydroxypropylcellulose, starch derivatives, casein, gum Arabic, gelatin, ethylene-maleic anhydride copolymer, styrene-maleic anhydride copolymer, polyvinyl alcohol, epichlorohydrin-modified polyamide, isobutylene-maleinsalicylic anhydride copolymer, polyacrylic acid, polyacrylic amide and the like, as well as modified substances thereof. Examples of the latexes include styrene-butadiene rubber latex, methyl acrylate-butadiene rubber latex, vinyl acetate emulsion and the like.

In the heat sensitive recording layer of the present invention, it is also preferable to use known antioxidants shown below or the like, for improving durability of a color developed image against light and heat and for reducing yellowing by light of non-printed portions (non-image portions) after being fixed.

Examples of the antioxidants include those described, for example, in European Patent (EP) Nos. 223739, 309401, 309402, 310551, 310552 and 459416, German Patent No. 3435443, JP-A Nos. 54-48535, 62-262047, 63-113536, 63-163351, 2-262654, 2-71262, 3-121449, 5-61166 and 5-119449, and U.S. Pat. Nos. 4,814,262 and 4,980,275.

In the present invention, methods for using components such as the coupler, the organic base, the sensitizer and the like are not particularly restricted, and examples of methods for using such components include solid-dispersion, emulsion-dispersion, polymer-dispersion, latex-dispersion, microcapsulation, and the like.

Method of Producing Microcapsules

In the invention, the three or more diazonium salt compounds represented by the general formula (I) are contained in a microcapsule, for suppressing crystallization of a color developed portion.

As the method of microcapsulating the three or more diazonium salt compounds represented by the general formula (I), conventionally known methods can be used. One example thereof is an interfacial polymerization method in which three or more diazonium salt compounds represented by the general formula (I) are simultaneously dissolved or dispersed in a substantially water-insoluble organic solvent to prepare an oil phase which is mixed with an aqueous phase in which a water-soluble polymer is dissolved. The resulting mixture is emulsion-dispersed by a means such as a homogenizer and then heated to cause a polymer forming reaction at surface of drops of the oil, thereby forming microcapsule walls of a high polymer substance. This interfacial polymerization method can form capsules having uniform particle size in a short period of time and provide a recording material excellent in preservability.

Examples of the above-mentioned organic solvent include, auxiliary solvents of a low boiling point such as acetates, methylene chloride, cyclohexanone and the like, and/or, phosphates, phthalates, acrylates, methacrylates, other carboxylates, fatty amides, alkylated biphenyls, alkylated terphenyls, alkylated naphthalenes, diarylethanes, chlorinated paraffins, alcohol-based solvents, phenol-based solvents, ether-based solvents, monoolefin-based solvents, epoxy-based solvents and the like are listed.

Specific examples thereof include solvents of a higher boiling point such as tricresyl phosphate, trioctyl phosphate, octyldiphenyl phosphate, tricyclohexyl phosphate, dibutyl phthalate, dioctyl phthalate, phthalic dilaurate, dicyclohexyl phthalated, butyl olefinate, diethylene glycol benzoate, dioctyl sevacate, dibutyl sevacate, dioctyl adipate, triocryl trimellitate, acetyltriethyl citrate, octyl maleate, dibutyl maleate, isoamylbiphenyl, chlorinated paraffin, diisopropylnaphthalene, 1,1'-ditolylethane, monoisopropylbiphenyl, diisopropylbiphenyl, 2,4-ditertiary amylphenol, N,N-dibutyl-2-butoxy-5-tertiary octylaniline, 2-ethylhexyl hydroxybenzoate, polyethylene glycol and the like.

Among these, alcohol-based solvents, phosphate-based solvents, carboxylate-based solvents, alkylated biphenyls, alkylated terphenyls, alkylated naphthalenes, and diaryle-thanes are particularly preferable.

Further, carbonization inhibitors such as hindered phenol, hindered amine and the like may be added to the above-mentioned solvents of a higher boiling point. Among the above-mentioned solvenst of a higher boiling point, those having an unsaturated fatty acid are particularly preferable, and examples thereof include α-methylstyrene dimer and the like. Examples of the α-methylstyrene dimer include MSD100 (trade name, manufactured by Mitsui Toatsu Chemicals Inc.) and the like.

Examples of the water-soluble polymer include polyvinyl alcohol, silanol-modified polyvinyl alcohol, carboxyl-modified polyvinyl alcohol, amino-modified polyvinyl alcohol, itaconic acid-modified polyvinyl alcohol, styrene-maleic anhydride copolymer, butadiene-maleic anhydride copolymer, ethylene-maleic anhydride copolymer, isobutylene-maleic anhydride copolymer, polyacrylamide, polystyrenesulfonic acid, polyvinylpyrrolidone, ethylene-acrylic acid copolymer, gelatin and the like, and among these, carboxyl-modified polyvinyl alcohol is preferable.

Emulsions or latexes of hydrophobic polymers and the like can also be used together with the water-soluble polymer. Examples of the emulsion or latex include a styrene-butadiene copolymer, a carboxyl-modified styrene-butadiene copolymer, an acrylonitrile-butadiene copolymer and the like. In this case, conventionally known surfactants and the like may be added as necessary.

As the polymer substance constituting the microcapsule walls, for example, polyurethane resins, polyurea resins, polyamide resins, polyester resins, polycarbonate resins, aminoaldehyde resins, melamine resins, polystyrene resins, styrene-acrylate copolymer resins, styrene-methacylate copolymer resins, gelatin, polyvinyl alcohol and the like are listed. Among these, polyurethane/polyurea resins are particularly preferable.

For example, when polyurethane/polyurea resins are used as a material for the capsule walls, a microcapsule wall precursor such as a polyvalent isocyanate or the like is capsulated and mixed into an oily medium (oil phase) to be used as a core material, a second substance (for example, polyol or polyamine) which reacts with the microcapsule wall precursor to form the capsule walls is mixed into a water-soluble polymer aqueous solution (aqueous phase), and the oil phase is emulsion-dispersed into the aqueous phase. The dispersion is then heated to cause a polymer forming reaction at the surfaces of drops of the oil, and microcapsule walls can thus be formed.

Specific examples of the above-mentioned polyvalent isocyanate compound are listed below, but these are not restrictive examples. Examples thereof include isocyanate prepolymers including diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-diphenylmethane-4,4'-diisocyanate, xylene-1,4-diisocyanate, 4,4'-diphenylpropane diisocyanate, trimethylene diisocyanate, hexamethylene diisocyanate, propylene-1,2-diisocyanate, butylenes-1,2-diisocyanate, cyclohexylene-1,2-diisocyanate, cyclohexylene-1,4-diisocyanate and the like; triisocyanates such as 4,4',4"-triphenylmethane triisocyanate, toluene-2,4,6-triisocyanate and the like; tetraisocyanates such as 4,4'-dimethylphenylmethane-2,2',5,5'-tetraisocyanate and the like; an adduct of hexamethylene diisocyanate and trimethy-lolpropane; an adduct of 2,4-tolylene diisocyanate and tri-methylolpropane; an adduct of xylylene diisocyanate and trimethylolpropane; an adduct of tolylene diisocyanate and hexane triol; and the like.

If necessary, two or more of the above-mentioned compounds may be used together, and among them, those having three of more isocyanate groups in a molecule are particularly preferable.

Also, the above-described method can be used when the above-mentioned diazonium compounds and electron-donating colorless dye and the like are microcapsualted. In the method of microcapsulation, the organic solvents for dissolving other components such as the coupler (and the electron-accepting compound), the organic base, the sensitizer and the like, a microcapsule wall precursor and a second substance reacting therewith, are the same as the above-mentioned organic solvents.

A diameter of the microcapsules is preferably from 0.1 to 2.0 μm, and more preferably from 0.2 to 1.5 μm.

Specific constituent embodiments of multi-color recording materials will be described below.

The heat-sensitive recording material of the invention may be either of a single color heat-sensitive recording material having one heat sensitive recording layer disposed on a substrate, and a multi-color heat-sensitive recording material having a heat sensitive recording layer of laminated structure comprising a plurality of single color recording layers.

Particularly in the case of a full color heat sensitive recording layer containing cyan, yellow and magenta, a heat-sensitive recording material in which a substrate is disposed with three layers all comprising diazo color developing agents, or in which a first heat-sensitive recording layer adjacent to the substrate comprises a leuco color developing agent containing an electron-donating dye and an electron-accepting compound and second and third layers comprise diazo color developing agents is preferable. The heat-sensitive recording material of the present invention preferably has a construction in which the substrate is laminated with heat-sensitive recording layers respectively developing colors of cyan, magenta and yellow in this order. In particular, it is optimum that the heat sensitive recording layer of the present invention including microcapsules containing three or more diazonium salt compounds represented by the general formula (I), is the heat-sensitive recording layer developing yellow.

The heat-sensitive recording material of the invention may also be constructed according to the following embodiments (a) to (c).

Embodiment (a) provides a recording material laminated with a light fixation recording layer (first recording layer (layer A)) containing diazonium salt compounds having maximum absorption wavelength of 365±40 nm and a coupler which reacts with the diazonium salt compounds to perform color developing, and a light fixation recording layer (second recording layer (layer B)) containing diazonium salt compounds having maximum absorption wavelength of 420±40 nm and a coupler which reacts with the diazonium salt compounds to develop color, and, if necessary, further laminated with a light transmittance controlling layer and protective layer.

Embodiment (b) provides a recording material comprising a substrate laminated in the following order to a recording layer (first recording layer (layer A)) containing an electron-donating dye and an electron-accepting compound, a light fixation recording layer (second recording layer (layer B)) containing diazonium salt compounds having maximum absorption wavelength of 365±40 nm and a coupler which reacts with this diazonium salt compounds to perform color developing, and a light fixation recording layer (third recording layer (layer C)) containing diazonium salt compounds having maximum absorption wavelength of 420±40 nm and a coupler which reacts with the diazonium salt compounds to perform color developing, and, if necessary, further laminated with a light transmittance controlling layer and protective layer.

Embodiment (c) provides a recording material comprising a substrate laminated in the following order with a light fixation recording layer (first recording layer (layer A)) containing diazonium salt compounds having maximum absorption wavelength of 350 nm or less and a coupler reacting with the diazonium salt compounds to perform color developing, a light fixation recording layer (second recording layer (layer B)) containing diazonium salt compounds having maximum absorption wavelength of 365±40 nm and a coupler which reacts with the diazonium salt compounds to perform color developing, and a light fixation recording layer (third recording layer (layer C)) containing diazonium salt compounds having maximum absorption wavelength of 420±40 nm and a coupler which reacts with the diazonium salt compounds to perform color developing, and, if necessary, further laminated with a light transmittance controlling layer and protective layer.

A method of multi-color recording is described below using the recording material of the embodiments (b) or (c).

First, the third recording layer (layer C) is heated, to allow a diazonium salt and a coupler contained in this layer to color develop. Next, an unreacted diazonium salt compound contained in the layer C is irradiated with light having an emission center wavelength of 430±30 nm so as to be decomposed and cause light fixation. Then, sufficient heat is applied for color development of the second recording layer (layer B), or specifically to cause color development of a diazonium salt compound and a coupler contained in this layer. In this procedure, the layer C is also strongly heated but since the diazonium salt compounds contained therein has already decomposed (light fixed) and thereby lost color developability, color development does not occur. Further, a diazonium salt compound contained in the layer B is irradiated with light having an emission center wavelength of 360±20 nm so as to be decomposed and cause light fixation. Then, finally, heat sufficient for color development of the first recording layer (layer A) is applied to cause color development. In this procedure, the layer C and the layer B are also simultaneously strongly heated, however, since the diazonium salt compounds contained therein have already decomposed to lose color developability, color development does not occur.

When all of the recording layers (layer A, layer B and layer C) are diazo-based recording layers, it is necessary that the layer A and the layer B are subjected to light fixation after color development. The layer C, however, which is image-recorded last, is not necessarily required to be light-fixed.

A light source used for light fixation can be appropriately selected from known light sources, and examples thereof include various fluorescent lamps, xenon lamps, mercury lamps and the like. Among these, light sources having an emission spectrum approximately coinciding with the absorption spectrum of the diazonium salt compounds used in the recording material are preferable for high-efficiency light fixation.

In the heat-sensitive recording material of the present invention, embodiments having a light transmittance controlling layer and a protective layer further disposed on the substrate in addition to the single or the plurality of heat-sensitive recording layers are preferable.

Light Transmittance Controlling Layer

The light transmittance controlling layer contains an ultraviolet absorber precursor. This precursor does not function as an ultraviolet absorber, and the layer has high transmittance before irradiation with light having a wavelength in a range necessary for fixation. Therefore, when the light fixation heat-sensitive recording layer is fixed, light of a wavelength within the range necessary for fixation is sufficiently transmitted. Further, transmittance of visible light is also high, and consequently, fixation of the heat sensitive recording layer is not disturbed. It is preferable that this ultraviolet absorber precursor is contained in microcapsules.

Examples of the compounds contained in the light transmittance controlling layer include those described in JP-A No. 9-1928.

After completion of irradiation with light having a wavelength in a range necessary for fixation of the heat sensitive recording layer, a reaction is caused with the aid of light, heat or the like, whereby the ultraviolet absorber precursor subsequently functions as an ultraviolet absorber, and most light in the ultraviolet region having wavelengths within the range necessary for fixation is absorbed by the ultraviolet absorber, and transmittance lowered and light resistance of the heat-sensitive recording material is improved. The light transmittance controlling layer does not absorb visible light, however, and transmittance of visible light does not substantially change.

At least one light transmittance controlling layer can be provided in the heat-sensitive recording material, and most preferably be formed between the heat-sensitive recording layer and an outermost protective layer. The light transmittance controlling layer, however, may also function the protective layer simultaneously. The properties of the light transmittance controlling layer can be appropriately selected depending on the properties of the heat sensitive recording layer.

An application solution for forming the light transmittance controlling layer (light transmittance controlling layer application solution) is obtained by mixing the above-mentioned components. This light transmittance controlling layer application solution can be applied by a known application means such as a bar coater, an air knife coater, a blade coated, a curtain coater and the like to form the light transmittance controlling layer. The light transmittance controlling layer may be applied simultaneously with the heat sensitive recording layer and the like. Alternatively, for example, the solution may be applied to the recording layer to form the light transmittance controlling layer after an application solution for forming the heat-sensitive recording layer is applied and dried.

A dry application amount of the light transmittance controlling layer is preferably from 0.8 to 4.0 $g/m^2$.

Protective Layer

The protective layer contains a pigment, lubricant, a surfactant, a dispersing agent, a fluorescent whitening agent, a metal soap, a film hardener, an ultraviolet absorber, a cross-linking agent and the like, together with a binder.

The binder can be appropriately selected from among polyvinyl alcohol, methylcellulose, carboxymethylcellulose, hydroxyethylcellulose, starches, gelatins, gum Arabic, casein, styrene-maleic anhydride copolymer hydrolyzate, ethylene-maleic anhydride copolymer hydrolyzate, isobutylene-maleic anhydride copolymer hydrolyzate, polyvinyl alcohol, denatured polyvinyl alcohol, polyacrylamide and the like, and used in an amount not deteriorating barrier property and workability.

Additional examples of the binders include synthetic rubber latex, synthetic resin emulsion and the like, and examples thereof include styrene-butadiene rubber latex, acrylonitrile-butadiene rubber latex, methyl acrylate-butadiene rubber latex, vinyl acetate emulsion and the like.

A content of the above-mentioned binder is preferably from 10 to 500% by weight, and more preferably from 50 to 400% by weight based on the pigment contained in the protective layer.

In order to further improve water resistance, it is effective to use a cross-linking agent together with a catalyst for promoting a reaction. Examples of the cross-linking agent include epoxy compounds, blocked isocyanates, vinylsulfone compounds, aldehyde compounds, methylol compounds, boric acid, carboxylic anhydrides, silane compounds, chelate compounds, halides and the like, and those which can adjust the pH level of an application solution for forming a protective layer to within a range of 6.0 to 7.5 are preferable. Examples of the catalyst include known acids, metal salts and the like, and those which can adjust the pH level of the application solution to within a range of 6.0 to 7.5 are preferable as described above.

Known organic or inorganic pigments can be used as the pigment, and specific examples thereof include calcium carbonate, aluminum hydroxide, barium sulfate, titanium oxide, talc, agalmatolite, kaolin, calcinated kaolin, amorphous silica, colloidal silica, urea formalin resin powder, polyethylene resin powder, benzoguanamine resin powder and the like. These can be used alone or as a mixture of two or more thereof.

Suitable examples of the lubricant include zinc stearate, calcium stearate, paraffin wax, polyethylene wax and the like.

Alkali metal salts of sulfosuccinic acid type, fluorine-containing surfactants and the like are suitably used as the surfactant so that the protective layer can be uniformly formed on the heat sensitive recording layer. Specific examples thereof include sodium salts and ammonium salts of di-(2-ethylhexyl)sulfosuccinic acid, di-(n-hexyl) sulfosuccinic acid, and the like.

The application solution for forming a protective layer (protective layer application solution) is obtained by mixing the above-mentioned components. Further, if necessary, a releasing agent, wax, water-repelling agent and the like may be added.

The heat-sensitive recording material of the present invention can be formed by applying the protective layer application solution to the heat-sensitive recording layer formed on the substrate, by a known application method, and examples thereof include methods using a bar coater, an air knife coater, a blade coater, a curtain coater or the like.

The protective layer may be applied together with the heat-sensitive recording layer and the light transmittance controlling layer. Alternatively, the protective layer is applied and formed on the recording layer after the application solution for forming the heat-sensitive recording material is applied and dried.

A dry application amount of the protective layer is preferably from 0.2 to 7 g/m², and more preferably from 1 to 4 g/m². When the dry application amount is less than 0.2 g/m², water resistance may not be maintained, and when greater than 7 g/m², heat sensitivity may remarkably decrease. After application and formation of the protective layer, calender treatment may be performed, if necessary.

Intermediate Layer

When the substrate is laminated with a plurality of the heat-sensitive recording layers, it is preferable to provide an intermediate layer between heat-sensitive recording layers. In the intermediate layer, a pigment, a lubricant, a surfactant, a dispersing agent, a fluorescent whitening agent, a metal soap, an ultraviolet absorber and the like can be contained in various binders, as in the protective layer. As the binder, the same binders as those listed for the protective layer can be used.

Substrate

For the substrate, polyethylene terephthalate (PET), polyethylene naphthalate (PEN), triacetylcellulose (TAC), paper, plastic resin laminated paper, synthetic paper and the like can be used. Further, for obtaining a transparent heat-sensitive recording material, it is necessary to use a transparent substrate, and synthetic polymer films including polyester films such as polyethylene terephthalate, polybutylene terephthalate and the like, cellulose triacetate films, polyolefin films such as polypropylene, polyethylene and the like, are examples thereof.

The substrate can be used alone or in laminated form.

The thickness of the above-mentioned synthetic polymer film is preferably from 25 to 300 $\mu$m, and more preferably from 100 to 250 $\mu$m.

The synthetic polymer film may be colored any hue, and as a method for coloring the polymer film, a dye can be kneaded into a resin prior to film formation. In another method, a dye is dissolved in a suitable solvent which is applied to a transparent colorless resin film by a known application method, such as a gravure coat method, a roller coat method, a wire coat method or the like, and then dried. Other methods may be used as well. Particularly preferably, a polyester resin such as polyethylene terephthalate, polyethylene naphthalate or the like, with a blue dye kneaded therein is molded into a film, and heat-resistance treatment, drawing treatment, antistatic treatment are performed thereon.

The heat-sensitive recording layer, the protective layer, the light transmittance controlling layer, the intermediate layer and the like can be formed by applying respective solutions to the substrate by a known application method, such as a blade application method, an air knife application method, a gravure application method, a roll coating application method, a spray application method, a dip application method, a bar application method and the like, and then drying.

EXAMPLES

The following examples illustrate the present invention further specifically below, but do not limit the scope of the invention.

Example 1

Preparation of Phthalated Gelatin Aqueous Solution 32 parts by weight of phthalated gelatin (trade name: MGP Gelatin, manufactured by Nippi Collagen Co., Ltd.), 0.9143 parts by weight of 1,2-benzothiazolin-3-one (3.5% methanol solution, manufactured by Daito Chemical Industries, Ltd.) and 367.1 parts by weight of ion exchanged water were mixed and dissolved at 40° C. to obtain a phthalated gelatin aqueous solution.

Preparation of Alkali-Treated Gelatin Aqueous Solution 25.5 parts by weight of alkali-treated low ion gelatin (trade name; #750 Gelatin, manufactured by Nitta Gelatin Inc.), 0.7286 parts by weight of 1,2-benzothiazolin-3-one (3.5% methanol solution, manufactured by Daito Chemical Industries, Ltd.), 0.153 parts by weight of calcium hydroxide and 143.6 parts by weight of ion exchanged water were mixed and dissolved at 50° C., to obtain an alkali-treated gelatin aqueous solution.

Preparation of Yellow Heat Sensitive Recording Layer Application Solution (a)

(Preparation of Diazonium Salt Compound-Containing Microcapsule Solution (a))

1.1 parts by weight of the following diazonium salt compound (A) (maximum absorption wavelength: 420 nm), 1.1 parts by weight of the following diazonium salt compound (B) (maximum absorption wavelength: 420 nm), 1.1 parts by weight of the following diazonium salt compound (C) (maximum absorption wavelength: 420 nm), 1.1 parts by weight of the following diazonium salt compound (D) (maximum absorption wavelength: 420 nm), 2.4 parts by weight of monoisoproylbiphenyl, 7.2 parts by weight of diphenyl phthalate and 0.4 parts by weight of diphenyl(2,4,6-trimethylbenzoyl)phosphine oxide (trade name: Lucirin TPO, manufactured by BASF Japan Ltd.) was added to 16.1 parts by weight of ethyl acetate, and then the mixture was uniformly dissolved while heating at 40° C.

8.6 parts by weight of a mixture of xylylene diisocyanate/trimethylolpropane adduct and xylylene diisocyanate/bisphenol A adduct (trade name: Takenate D119N (50% by weight ethyl acetate solution), manufactured by Takeda Chemical Industries, Ltd.), and they were stirred uniformly to obtain a mixture (I) was added to this mixture.

Separately, 16.3 parts by weight of ion exchanged water and 0.34 parts by weight of a 50% by weight alkylglucoside-based surfactant (trade name: Scraph AG-8, manufactured by Nippon Fine Chemical Co., Ltd.) was added to 58.6 parts by weight of the above-mentioned phthalated gelatin aqueous solution in order to obtain a mixture (II).

The mixture (I) was added to the mixture (II), and then the resulted mixture was emulsion-dispersed by using a homogenizer (manufactured by Nippon Seiki Co., Ltd.) at 40° C. 20 parts by weigh of water was added to the resulted emulsion and then uniformalized. Then a capsulation reaction was conducted for 3 hours by stirring the solution at 40° C. while removing ethyl acetate. 4.1 parts by weight of an ion exchanged resin (trade name: Amberlite IRA 68) and 8.2 parts by weight of an ion exchanged resin (trade name: Amberlite IRC 50) (both manufactured by Organo Corporation) were added to the mixture, and the mixture was further stirred for 1 hour. After the ion exchanged resins were filtrated off, the concentration of the mixture was adjusted so that the solid component concentration of the capsule solution was 20.0% in order to obtain a diazonium salt compound-containing microcapsule solution (a). The diameter of the resulted microcapsules was 0.46 μm in terms of a median diameter measured with a particle size measurement apparatus (trade name: LA-700, manufactured by Horiba, Ltd.).

Diazonium salt compound (A)

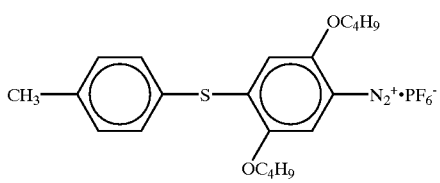

Diazonium salt compound (B)

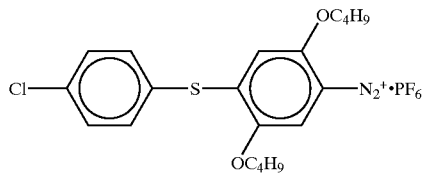

Diazonium salt compound (C)

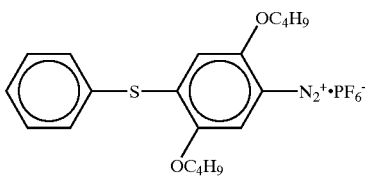

Diazonium salt compound (D)

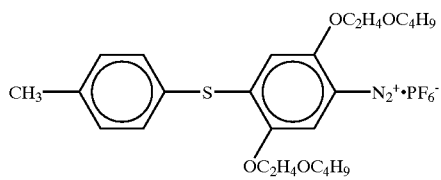

Preparation of Coupler Emulsion (a)

9.9 parts by weight of the following coupler (E) 9.9 parts by weight of triphenylguanidine (manufactured by Hodogaya Chemical Co., Ltd.), 20.8 parts by weight of 4,4'-(m-phenylenediisopropylidene)diphenol (trade name: Bisphenol M (manufactured by Mitsui Petrochemical Industries, Ltd.)), 3,3 parts by weight of 3,3,3',3'-tetramethyl-5,5',6,6'-tetra(1-propyloxy)-1,1'-spirobisindane (manufactured by Sankyo Chemical Industries, Ltd.), 13.6 parts by weight of 4-(2-ethyl-1-hexyloxy)benzenesulfonic amide (manufactured by Manac Incorporated), 6.8 parts by weight of 4-n-pentyloxybenzenesulfonic amide (manufactured by Manac Incorporated), and 4.2 parts by weight of calcium dodecylbenzenesulfonate (trade name: Pionin A-41-C, 70% methanol solution, manufactured by Takemoto Oil & Fat Co., Ltd.) were dissolved into 33.0 parts by weight of ethyl acetate in order to obtain a mixture (III).

Separately, 107.3 parts by weight of ion exchanged water was mixed with 206.3 parts by weight of the above-mentioned alkali-treated gelatin aqueous solution in order to obtain a mixture (IV).

The mixture (III) was added to the mixture (IV). The resulted mixture was emulsion-dispersed by using a homogenizer (manufactured by Nippon Seiki Co., Ltd.) at 40° C. The resulted coupler emulsion was heated under reduced pressure to remove ethyl acetate. Then, the concentration of the resulted coupler emulsion was controlled to give a solid concentration of 26.5% by weight. The diameter of the resulted coupler emulsion was 0.21 μm in terms of median diameter measured with a particle size measurement apparatus (trade name: LA-700, manufactured by Horiba, Ltd.).

Further, 9 parts by weight of SBR latex (trade name: SN-307, 48% by weight solution, manufactured by Sumika ABS Latex) of which concentration had been adjusted to 26.5% by weight was added to 100 parts by weight of the above-mentioned coupler emulsion to give a coupler emulsion (a).

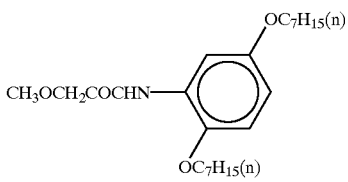

Coupler (E)

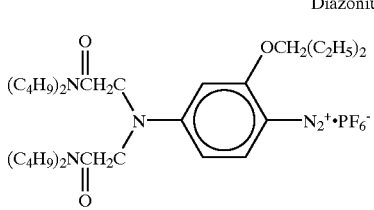

Diazonium salt compound (F)

Preparation of Yellow Heat Sensitive Recording Layer Application Solution (a)

The diazonium salt compound-containing microcapsule solution (a) and the coupler emulsion (a) were mixed so that the weight ratio of coupler/diazonium salt compound was 2.2/1 so as to give a yellow heat sensitive recording layer application solution (a).

Preparation of Yellow Heat Sensitive Recording Layer Application Solution (b)

Preparation of Diazonium Salt Compound-Containing Microcapsule Solution (b)

2.8 parts by weight of the following diazonium salt compound (F) (maximum absorption wavelength: 365 nm), 7.7 parts by weight of diphenyl phthalate, 4.2 parts by weight of monoisopropylbiphenyl and 4.2 parts by weight of calcium dodecylbenzenesulfonate (trade name: Pionin A-41-C, 70% methanol solution, manufactured by Takemoto Oil & Fat Co., Ltd.) were added to 15.1 parts by weight of ethyl acetate, and the mixture was uniformly dissolved with heating.

Then, as a capsule wall material, 2.5 parts by weight of a mixture of xylylene diisocyanate/trimethylolpropane adduct and xylylene diisocyanate/bisphenol A adduct (trade name: Takenate D119N (50% by weight ethyl acetate solution), manufactured by Takeda Chemical Industries, Ltd.), and 6.8 parts by weight of xylylene diisocyanate/trimethylolpropane adduct (trade name: Takenate D110N (75% by weight ethyl acetate solution), manufactured by Takeda Chemical Industries, Ltd.) were added to the mixture. Then the mixture was stirred uniformly to obtain a mixture (V).

Separately, 21.0 parts by weight of ion exchanged water was added to 55.3 parts by weight of the above-mentioned phthalated gelatin aqueous solution in order to obtain a mixture (VI).

The mixture (V) was added to the mixture (VI). The resulted mixture was emulsion-dispersed by using a homogenizer (manufactured by Nippon Seiki Co., Ltd.) at 40° C. 24 parts by weigh of water was added to the resulted emulsion, uniformalized, and then a capsulation reaction was conducted for 3 hours by stirring the solution at 40° C. while removing ethyl acetate. Further, 4.1 parts by weight of an ion exchanged resin (trade name: Amberlite IRA 68) and 8.2 parts by weight of an ion exchanged resin (trade name: Amberlite IRC 50) (both manufactured by Organo Corporation) were added, and the mixture was further stirred for 1 hour. After the ion exchanged resins were filtrated off from the mixture, the concentration was adjusted so that the solid component concentration of the capsule solution was 20.0% in order to obtain a diazonium salt compound-containing microcapsule solution (b). The diameter of the resulted microcapsules was 0.48 μm in terms of median diameter measured with a particle size measurement apparatus (trade name: LA-700, manufactured by Horiba, Ltd.).

Preparation of Coupler Emulsion (b)

11.9 parts by weight of the following coupler (G), 14.0 parts by weight of triphenylguanidine (manufactured by Hodogaya Chemical Co., Ltd.), 14.0 parts by weight of 4,4'-(m-phenylenediisopropylidene)diphenol (trade name: Bisphenol M (manufactured by Mitsui Petrochemical Industries, Ltd.)), 14 parts by weight of 1,1-(p-hydroxyphenyl)-2-ethylhexane, 3.5 parts by weight of 3,3,3',3'-tetramethyl-5,5',6,6'-tetra(1-propyloxy)-1,1'-spirobisindane (manufactured by Sankyo Chemical Industries, Ltd.), 3.5 parts by weight of the following compound (H), 1.7 parts by weight of tricresyl phosphate, 0.8 parts by weight of diethyl maleate, and 4.5 parts by weight of calcium dodecylbenzenesulfonate (trade name: Pionin A-41-C, 70% methanol solution, manufactured by Takemoto Oil & Fat Co., Ltd.) were dissolved to 36.9 parts by weight of ethyl acetate in order to obtain a mixture (VII).

Separately, 107.3 parts by weight of ion exchanged water was mixed to 206.3 parts by weight of the alkali-treated gelatin aqueous solution in order to obtain a mixture (VIII).

The mixture (VII) was added to the mixture (VIII). The resulted mixture was emulsion-dispersed by using a homogenizer (manufactured by Nippon Seiki Co., Ltd.) at 40° C. The resulted coupler emulsion was heated under reduced pressure to remove ethyl acetate. Then, the concentration of the coupler emulsion was controlled to give a solid concentration of 24.5% by weight so as to give a coupler emulsion (b). The diameter of the resulted coupler emulsion was 0.22 μm in terms of median diameter measured with a particle size measurement apparatus (trade name: LA-700, manufactured by Horiba, Ltd.).

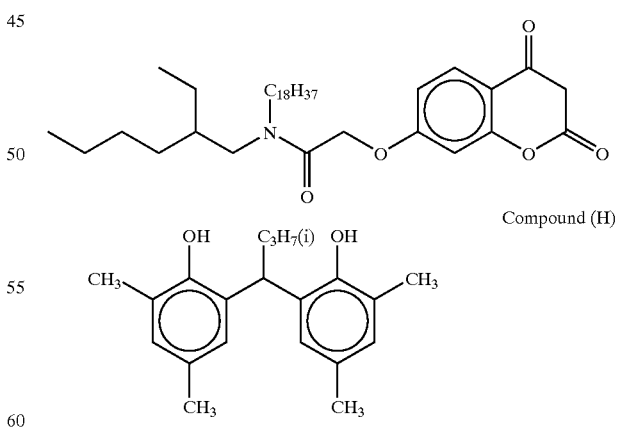

Coupler (G)

Compound (H)

Preparation of Magenta Heat Sensitive Recording Layer Application Solution (b)

The diazonium salt compound-containing microcapsule solution (b) and the coupler emulsion (b) were mixed so that the weight ratio of coupler/diazonium salto compound was 3.5/1. Further, 0.2 parts of a polystyrenesulfonic acid (partially potassium hydroxide neutralized type) aqueous solution (5% by weight) was mixed to 10 parts by the above-mentioned microcapsule solution (b) in order to give a magenta heat sensitive recording layer application solution (b).

Preparation of Cyan Heat Sensitive Recording Layer Application Solution (c)

Preparation of Electron-Donating Dye Precursor-Containing Microcapsule Solution (c)

7.6 parts by weight of the following electron-donating dye precursor (M), 8.0 parts by weight of a mixture of 1-methylpropylphenyl-phenylmethane and 1-(1-methylpropylphenyl)-2-phenylethane (trade name: Hysol SAS-310, manufactured by Nippon Oil Co., Ltd.) and 8.0 parts by weight of the compound (I) (trade name: Irgaperm 2140, manufactured by Chiba Geigy) were added to 18.1 parts by weight of ethyl acetate, and the mixture was uniformly dissolved with heating.

Then, as a capsule wall material, 7.2 parts by weight of a mixture of xylylene diisocyanate/trimethylolpropane adduct (trade name: Takenate D110N (75% by weight ethyl acetate solution), manufactured by Takeda Chemical Industries, Ltd.) and 5.3 parts by weight of polymethylene polyphenyl polyisocyanate (trade name: Millionate MR-200, manufactured by Nippon Polyurethane Industry Co., Ltd.) were added to the mixture. The resulted mixture was stirred uniformly to obtain a mixture (IX).

Separately, 9.5 parts by weight of ion exchanged water, 0.17 parts by weight of a 50% by weight alkylglucoside-based surfactant aqueous solution (trade name: Scraph AG-8, manufactured by Nippon Fine Chemical Co., Ltd.) and 4.3 parts by weight of sodium dodecylbenzenesulfonate (10% by weight aqueous solution) were added to 28.8 parts by weight of the above-mentioned phthalated gelatin aqueous solution in order to obtain a mixture (X).

The mixture (IX) was added the mixture (X).

The resulted mixture was emulsion-dispersed by using a homogenizer (manufactured by Nippon Seiki Co., Ltd.) at 40° C. Then 50 parts by weight of water and 0.12 parts by weight of tetraethylenepentamine was added to the resulted emulsion. The resulted emulsion was uniformalized, and a capsulation reaction was conducted for 3 hours by stirring the solution at 65° C. while removing ethyl acetate. The concentration of the resulted capsule solution was adjusted so that the solid component concentration of the capsule solution was 33% by weight in order to obtain a microcapsule solution. The diameter of the resulted microcapsules was 1.00 μm in terms of median diameter measured with a particle size measurement apparatus (trade name: LA-700, manufactured by Horiba, Ltd.).

Further, 3.7 parts by weight of a 25% by weight sodium dodecylbenzenesulfonate aqueous solution (trade name: Neopellex F-25, manufactured by Kao Corp.) and 4,4'-bistriazinylaminostilbene-2,2'-disulfonic acid derivative (trade name: Kaycall BXNL, manufactured by Nippon Soda Co., Ltd.) were added to 100 parts by weight of the microcapsule solution. The mixture was stirred uniformly in order to obtain an electron-donating dye precursor-containing microcapsule dispersion (c).

Electron donative dye precursor (M)

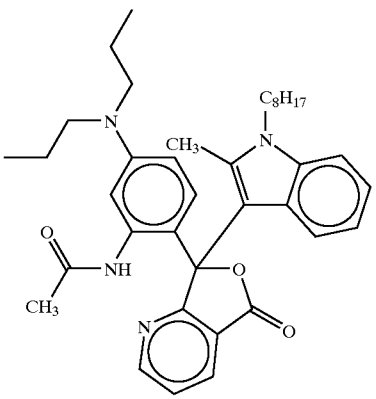

Compound (I)

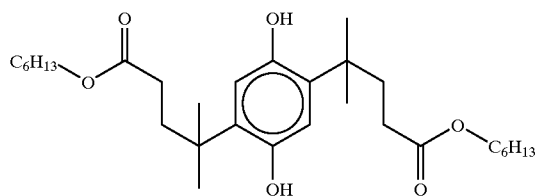

Preparation of Electron-Accepting Compound Dispersion (c)

30.1 parts by weight of ion exchanged water, 15 parts by weight of 4,4'-(p-phenylenediisopropylidene)diphenol (trade name: Bisphenol P, manufactured by Mitsui Petrochemical Industries, Ltd.), and 3.8 parts by weight of a 2% by weight sodium 2-ethylhexylsuccinate aqueous solution were dispersingly added to 11.3 parts by weight of the phthalated gelatin aqueous solution in a ball mill in order to obtain a dispersion. The solid concentration of the obtained dispersion was 26.6 w %.

45.2 parts by weight of the alkali-treated gelatin aqueous solution was added to 100 parts by weight of the dispersion, and the resulted mixture was stirred for 30 minutes. Then ion exchanged water was added so that the solid concentration of the dispersion was 23.5% by weight so as to give an electron-accepting compound dispersion (c).

Preparation of Cyan Heat Sensitive Recording Layer Application Solution (c)

The electron-donating dye precursor-containing microcapsule solution (c) and the electron-accepting compound dispersion (c) were mixed so that weight ratio of electron-accepting compound/electron-donating colorless dye precursor was 10/1 in order to obtain a cyan heat sensitive recording layer application solution (c).

Preparation of Intermediate Layer Application Solution 100.0 parts by weight of alkali-treated low ion gelatin (trade name; #750 Gelatin, manufactured by Nitta Gelatin Inc.), 2.857 parts by weight of 1,2-benzothiazolin-3-one (3.5% methanol solution, manufactured by Daito Chemical Industries, Ltd.), 0.5 parts by weight of calcium hydroxide and 521.643 parts by weight of ion exchanged water were mixed and dissolved at 50° C. in order to obtain an intermediate layer producing gelatin aqueous solution.

10.0 parts by weight of the above-mentioned intermediate layer producing gelatin aqueous solution, 0.05 parts by weight of sodium (4-nonylphenoxytrioxyethylene) butylsulfonate (manufactured by Sankyo Chemical Industries, Ltd., 2.0% by weight aqueous solution), 1.5 parts by weight of boric acid (4.0% by weight aqueous solution), 0.19 parts by weight of polystyrenesulfonic acid (partially potassium hydroxide neutralized type) aqueous solution (5% by weight), 3.42 parts by weight of a 4% by weight aqueous solution of the following compound (J) (manufactured by Wako Pure Chemical Industries, Ltd.), 1.13 parts by weight of a 4% by weight aqueous solution of the following compound (J') (manufactured by Wako Pure Chemical Industries, Ltd.), and 0.67 parts by weight of ion exchanged water were mixedin order to give an intermediate layer application solution.

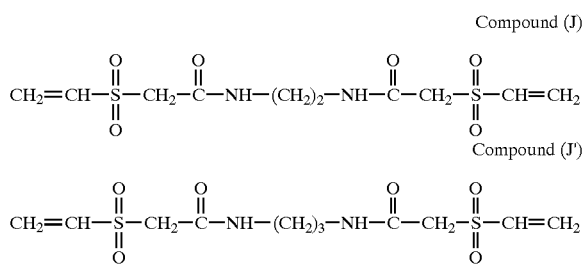

Compound (J)

Compound (J')

Preparation of Light Transmittance Controlling Layer Application Solution
Preparation of Ultraviolet Absorber Precursor Microcapsule Solution As an ultraviolet absorber precursor, 14.5 parts by weight of [2-allyl-5-(2H-benzotriazol-2-yl)-4-t-octylphenyl] benzenesulfonate, 5.0 parts by weight of 2,2'-t-octylhydroquinone, 1.9 parts by weight of tricresyl phosphate, 5.7 parts by weight of α-methylstyrene dimer (trade name: MSD-100, manufactured by Mitsui Chemical Co., Ltd.) and 0.45 parts by weight of calcium dodecylbenzenesulfonate (trade name: Pionin A-41-C (70% methanol solution), manufactured by Takemoto Oil & Fat Co., Ltd.) were uniformly dissolved into 71 parts by weight of ethyl acetate. As a capsule wall material, 54.7 parts by weight of xylylene diisocyanate/trimethylolpropane adduct (trade name: Takenate D110N (75% by weight ethyl acetate solution), manufactured by Takeda Chemical Industries, Ltd.) was added to the mixture. The resulted mixture was stirred uniformly to obtain an ultraviolet absorber precursor mixture.

Separately, 8.9 parts by weight of a 30% by weight phosphoric acid aqueous solution and 532.6 parts by weight of ion exchanged water were added to 52 parts by weight of itaconic acid-denaruted polyvinyl alcohol (trade name: KL-318, manufactured by Kuraray Co., Ltd.) in order to prepare a PVA aqueous solution for an ultraviolet absorber precursor microcapsule solution.

The ultraviolet absorber precursor mixture was added to 516.06 parts by weight of the PVA aqueous solution for an ultraviolet absorber precursor microcapsule solution, and the resulted mixture was dispersed by using a homogenizer (manufactured by Nippon Seiki Co., Ltd.) at 20° C. to obtain an emulsion. 254.1 parts by weight of ion exchanged water was added to the resulted emulsion. The mixture was then uniformalized and a capsulation reaction was conducted for 3 hours by stirring the solution at 40° C. Then, 94.3 parts by weight of an ion exchanged resin Amberlite (trade name) MB-3 (manufactured by Organo Corporation) was added to the mixture, and the mixture was further stirred for 1 hour in order to obtain a capsule solution. After the ion exchanged resin was filtrated off, the concentration of the capsule solution was adjusted so that the solid component concentration of the capsule solution was 13.5%. The diameter of the obtained microcapsules in the capsule solution was 0.23±0.05 μm in terms of median diameter measured with a particle size measurement apparatus (trade name: LA-700, manufactured by Horiba, Ltd.). 2.416 parts by weight of carboxy-modified styrene butadiene latex (trade name: SN-307, (48% by weight aqueous solution), manufactured by Sumitomo Norgatta) and 39.5 parts by weight of ion exchanged water were mixted into 859.1 parts by weight of this capsule solution in order to obtain an ultraviolet absorber precursor microcapsule solution.

Preparation of Light Transmittance Controlling Layer Application Solution 100 parts by weight of the above-mentioned ultraviolet absorber precursor microcapsule solution, 5.2 parts by weight of the following compound (K) (trade name: Megafack F-120, manufactured by Dainippon Ink and Chemicals, Incorporated) (5% by weight aqueous solution), 7.75 parts by weight of a 4% by weight sodium hydroxide aqueous solution and 73.39 parts by weight of sodium (4-nonylphenoxytrioxyethylene)butylsulfonate (manufactured by Sankyo Chemical Industries, Ltd., 2.0% by weight aqueous solution) were mixed in order to obtain a light transmittance controlling layer application solution.

Compound (K)

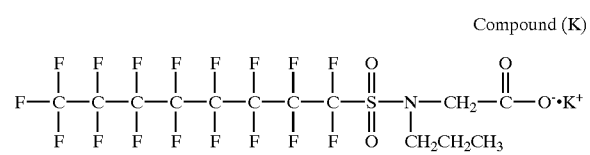

Preparation of Protective Layer Application Solution
Preparation of Protective Layer Polyvinyl Alcohol Solution 160 parts by weight of a vinyl alcohol-alkyl vinyl ether copolymer (trade name: EP-130, manufactured by Denki Kagaku Kogyo Kabushiki Kaisha), 8.74 parts by weight of a mixture of sodium alkylsulfoante and polyoxyethylene alkyl ether phosphate (trade name: Neoscore CM-57 (54% by weight aqueous solution, manufactured by Toho Chemical Industry Co., Ltd.) and 3832 parts by weight of ion exchanged water were mixed, and dissolved at 90° C. for 1 hour in order to obtain a uniform protective layer polyvinyl alcohol solution.

Preparation of Protective Layer Pigment Dispersion 0.2 parts by weight of an anionic special polycarboxylic acid polymer activating agent (trade name: Poise 532A (40% by weight aqueous solution), manufactured by Kao Corp.) and 11.8 parts by weight of ion exchanged water were mixed into 8 parts by weight of barium sulfate (trade name: BF-21F, barium sulfate content is 93% or more, manufactured by Sakai Chemical Industry Co., Ltd.), and the mixture was dispersed by a dino mill. The median diameter of the dispersed pigmenst was 0.15 μm or less measured with a particle size measurement apparatus (trade name: LA-910, manufactured by Horiba, Ltd.).

8.1 parts by weight of Colloidal Silica (trade name: Snowtex O (20% by weight aqueous solution), manufactured by Nissan Chemical Industries, Ltd.) was added to 45.6 parts by weight of the resulted dispersion in order to obtain the intended protective layer pigment dispersion.

Preparation of Protective Layer Matting Agent Dispersion 3.81 parts by weight of a water dispersion of 1-2 benzisothiazolin-3-one (trade name: PROXEL B.D, manufactured by I.C.I.) and 1976.19 parts by weight of ion exchanged water were mixed to 220 parts by weight of wheat starch (trade name: Komugi Denpun (wheat starch) S, manufactured by Shinshin Shokuryo Kogyo) and the mixture was uniformly dispersed in order to obtain a protective layer matting agent dispersion.

Preparation of Protective Layer Application Blend Solution 40 parts by weight of the above-mentioned compound (K) (trade name: Megafack F-120, manufactured by Dainippon Ink and Chemicals, Incorporated) (5% by weight aqueous solution), 50 parts by weight of sodium (4-nonylphenoxytrioxyethylene)butylsulfonate (manufactured by Sankyo Chemical Industries, Ltd., 2.0% by weight aqueous solution), 49.87 parts by weight of the above-mentioned protective layer pigment dispersion, 16.65 parts by weight of the protective layer matting agent dispersion and 48.7 parts by weight of a zinc stearate dispersion (trade name: Hydrin F115, 20.5% by weight aqueous solution, manufactured by Chukyo Fat & Oil K.K.) were uniformly mixed to 100 parts by weight of the protective layer polyvinyl alcohol solution in order to give a protective layer application blend solution.

Production of Substrate with Undercoat Layer

Preparation Undercoat Layer Application Solution 40 parts by weight of enzymolyzed gelatin (average molecular weight: 10000, PAGI method viscosity: 1.5 mPa's (15 mP), PAGI method jelly strength: 20 g) was added to 60 parts by weight of ion exchanged water. The mixture was dissolved by stirring at 40° C. in order to prepare an undercoat layer gelatin aqueous solution.

Separately, 8 parts by weight of water-swellable symthetic mica (aspect ratio: 1000, trade name: Somashif ME100, manufactured by Co-op Chemical Co., Ltd.) and 92 parts by weight of water were mixed, then, the mixture was wet-dispersed by a visco mill in order to obtain a mica dispersion having a volume-average particle size of 2.0 µm. Water was added to the mica dispersion was added so that the mica concentration was 5% by weight, and then they were uniformly mixed in order to prepare a desired mica dispersion.

Subsequently, 120 parts by weight of water and 556 parts by weight of methanol were added to 100 parts by weight of the 40% by weight undercoat layer gelatin aqueous solution at 40° C. The mixture was sufficiently stirred, and then, 208 parts by weight of the mica dispersion was added to the mixture. The mixture was further mixed by sufficient stirring, and then 9.8 parts by weight of a 1.66% by weight polyethylene oxide-based surfactant was added to the mixture. 7.3 parts by weight of a gelatin film hardening agent of an epoxy compound was further added to the mixture while maintaining the liquid temperature at 35° C. to 40° C. in order to prepare an undercoat layer application solution (5.7% by weight).

Production of Substrate with Undercoat Layer

Wood pulp composed of 50 parts by weight of LBPS and 50 parts by weight of LBPK was beat-broken by a double disk refiner to 300 ml of Canadian freeness, and to this was added 0.5 parts by weight of epoxidated behenic amide, 1.0 part by weight of anion polyacrylamide, 1.0 part by weight of aluminum sulfate, 0.1 part by weight of polyamide polyamine epichlorohydrin, and 0.5 parts by weight of cation polyacrylamide, all bone dry weight ratio. The mixture was subjected to a long net paper producer machine in order to obtain raw paper having weight of 114 g/m², which was then treated by a calender to give a thickness of 100 µm.

Corona discharge treatment was performed on both surfaces of the raw paper. Then polyethylene was coated on the raw paper by using a melt extruder in order to form a resin layer composed of a matting surface having a resin thickness of 36 µm (this surface is referred to as "rear surface"). Then, 10% by weight of anatase type titanium dioxide and polyethylene containing a trace amount of ultramarine were coated on a surface that is opposite to the rear surface on which the resin layer has been formed by using a melt extruder in order to form a resin layer having a glossy surface having a resin thickness of 50 µm (the surface is referred to as "front surface"). Corona discharge treatment was performed on the polyethylene resin coated surface on the rear surface. Then, a mixture of aluminum oxide (trade name: Alumina Sol 100, manufactured by Nissan Chemical Industries, Ltd.) and silicon dioxide (trade name: Snowtex O, manufactured by Nissan Chemical Industries, Ltd.) (adding ratio=1:2) dispersed in water was applied on the rear surface as antistatic agents so that the dry weight of the applied antistatic agents become 0.2 g/m². Next, corona discharge treatment was performed onto the front surface of the polyethylene resin coated surfaces. Then the undercoat layer application solution was applied onto the front surface of the polyethylene resin coated surfaces so that the applied amount of mica contained was 0.26 g/m² in order to obtain a substrate with an undercoat layer.

Application of Each Heat Sensitive Recording Layer Application Solution

The cyan heat sensitive recording layer application solution (c), the intermediate layer application solution (intermediate layer A), the magenta heat sensitive recording layer application solution (b), the intermediate layer application solution (intermediate layer B), the yellow heat sensitive recording layer application solution (a), the light transmittance controlling layer application solution and the protective layer application solution were sequentially applied in this order on the surface of the undercoat layer of the substrate. The coated solutions were dried continuously under conditions of a temperature of 30° C. and a relative humidity of 30%, and a temperature of 40° C. and a relative humidity of 30% in order to obtain a heat-sensitive recording material of Example 1. An applied amount of the diazonium salt compound (A) contained in the yellow heat sensitive recording layer application solution (a) was 0.078 g/m² in terms of solid content. And likewise, an applied amount of the diazonium salt compound (F) contained in the magenta heat sensitive recording layer application solution (b) was 0.206 g/m² in terms of solid content. An applied amount of the electron-donating colorless dye precursor (H) contained in the cyan heat sensitive recording layer application solution (c) was 0.355 g/m² in terms of solid content.

Further, an amount of the intermediate layer application solution was was 3.34 g/m² in terms of solid content. An amount of the intermediate layer B was 2.39 g/m² in terms of solid content. An amount of the light transmittance controlling layer application solution was 2.35 g/m² in terms of solid content. An amount of the protective layer was 1.39 g/m² in terms of solid content.

Example 2

A heat-sensitive recording material of Example 2 was obtained in the same manner as in Example 1 except that the following diazonium salt compound (L) was used instead of the diazonium salt compound (D) in preparation of the diazonium salt compound-containing microcapsule solution (a) in Example 1.

Diazonium salt compound (L)

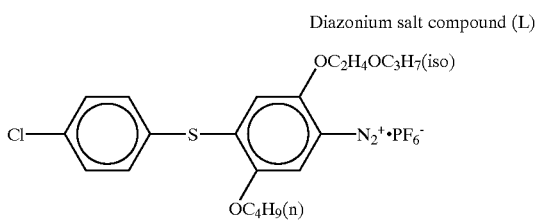

Example 3

A heat-sensitive recording material of Example 3 was obtained in the same manner as in Example 1 except that 1.6 parts by weight of the diazonium salt compound (A), 1.2 parts by weight of the diazonium salt compound (B) and 1.6 parts by weight of the diazonium salt compound (C) were used instead of the diazonium salt compound (D) in preparation of the diazonium salt compound-containing microcapsule solution (a) in Example 1.

Comparative Example 1

A heat-sensitive recording material of Comparative Example 1 was obtained in the same manner as in Example 1 except that 4.4 parts by weight of the diazonium salt compound (B) was used without using the diazonium compounds (A), (C) and (D) in preparation of the diazonium salt compound-containing microcapsule solution (a) in Example 1.

Comparative Example 2

A heat-sensitive recording material of Comparative Example 2 was obtained in the same manner as in Example 1 except that 4.4 parts by weight of the diazonium salt compound (A) was used without using the diazonium compounds (B) to (D) in preparation of the diazonium salt compound-containing microcapsule solution (a) in Example 1.

Comparative Example 3

A heat-sensitive recording material of Comparative Example 3 was obtained in the same manner as in Example 1 except that 2.2 parts by weight of the diazonium salt compound (B) and 2.2 parts by weight of the diazonium salt compound (C) were used without using the diazonium compounds (A) and (D) in preparation of the diazonium salt compound-containing microcapsule solution (a) in Example 1.

Evaluation

Yellow Concentration Change in Image Part

Yellow concentration changes in image parts were evaluated on the heat-sensitive recording materials of Examples 1 to 3 and Comparative Examples 1 to 3 obtained as described above according to the following method. The results are shown in Table 1.

On each heat-sensitive recording material, a black image was printed by using a thermal head (trade name: NC370, manufactured by Fuji Photo Film Co., Ltd.), and 1 hour after printing, optically reflected yellow concentration of the black image part was measured by X-rite densitometer. The results are shown in Table 1.

Next, each heat-sensitive recording material was left for 14 days in a chamber which is regulated under constant temperature (30° C.) and relative humidity (80%) in order to perform forcible degradation treatment. Then the optically reflected yellow concentration of the black image part was measured by X-rite densitometer. The results are shown in Table 1.

Evaluation of Light Resistance of Yellow Image

On each of the heat-sensitive recording materials, a yellow image was printed by using a thermal head (trade name: NC370, manufactured by Fuji Photo Film Co., Ltd.) while controlling the concentration to OD=1.0. Then the printed yellow image part was continuously irradiated with light of 32000 lux for 240 hours by using a fluorescent lamp tester. Then a concentration of the yellow image part was measured by X-rite densitometer, and a residual ratio (%) was measured. The results are shown in Table 1.

TABLE 1

| | Diazonium salt compound | Yellow concentration change of black image | | Yellow concentration residual ratio after 35° C., 80% treatment | Yellow concentration residual ratio after fluorescent lamp irradiation |
| --- | --- | --- | --- | --- | --- |
| | | Before treatment | After treatment | | |
| Example 1 | Four kinds of compounds are used together | 1.61 | 1.59 | 98.7% | 90.8% |
| Example 2 | Four kinds of compounds are used together | 1.61 | 1.61 | 98.8% | 91.1% |
| Example 3 | Three kinds of compounds are used together | 1.60 | 1.57 | 98.1% | 90.2% |
| Comparative Example 1 | One | 1.57 | 1.29 | 82.2% | 90.7% |
| Comparative Example 2 | One | 1.61 | 1.57 | 97.5% | 81.2% |
| Comparative Example 3 | Two kinds of compounds are used together | 1.60 | 1.42 | 88.8% | 89.2% |

As shown in Table 1, decreases in yellow concentration in image parts are less in the heat-sensitive recording materials in which three or more diazonium salt compounds represented by the general formula (I) are contained in a microcapsule, as compared with those of the heat-sensitive recording materials of the comparative examples in which one or two diazonium salt compounds are used. Further, it is found that light resistance of images is excellent in the heat-sensitive recording materials of the present invention, as compared with that of Comparative Example 2 using only the diazonium salt compound (A).

As described above, the present invention can provide a heat-sensitive recording material which suppresses crystallization without decreasing the light resistance of a color developed portion, shows little discoloration with the passage of time, and manifests excellent image preservability.

What is claimed is:

1. A heat-sensitive recording material comprising a substrate having disposed thereon at least a heat-sensitive recording layer comprising:
   microcapsules;
   diazonium salt compounds contained within the microcapules and represented by the following general formula (I); and
   a coupler which undergoes coupling-reaction with the diazonium salt compounds to cause color development,
   wherein at least three different diazonium salt compounds represented by the general formula (I) are contained in the same microcapsule:

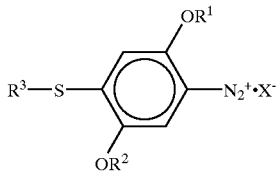

General formula (I)

(wherein $R^1$, $R^2$ and $R^3$ each independently represents an alkyl group, a substituted alkyl group, an aryl group or a substituted aryl group; and $X^-$ represents a counter anion).

2. The heat-sensitive recording material according to claim 1, wherein at least one of said diazonium salt compounds contained in the microcapsule is a compound represented by the following general formula (II):

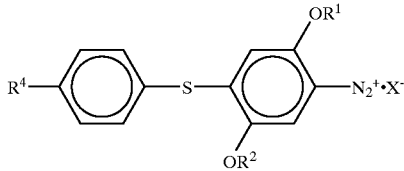

General formula (II)

(wherein $R^1$ and $R^2$ each independently represents an alkyl group, a substituted alkyl group, an aryl group or a substituted aryl group; $R^4$ represents an alkyl group; and $X^-$ represents a counter anion).

3. The heat-sensitive recording material according to claim 1, wherein each of the diazonium salt compounds contained in the microcapsule is contained in an amount of at least 5% by weight based on a total content of all of the diazonium salt compounds contained in the same microcapsule.

4. The heat-sensitive recording material according to claim 2, wherein each of the diazonium salt compounds contained in the microcapsule is contained in an amount of at least 5% by weight based on a total content of all of the diazonium salt compounds contained in the same microcapsule.

5. The heat-sensitive recording material according to claim 1, wherein the total number of carbon atoms in $R^1$, $R^2$ and $R^3$ in the general formula (I) is no less than 12.

6. The heat-sensitive recording material according to claim 2, wherein, in the general formula (II), $R^4$ represents methyl group or ethyl group.

7. The heat-sensitive recording material according to claim 1, wherein the diazonium salt compounds represented by the general formula (I) have melting points within a range from 30° C. to 200° C.

8. The heat-sensitive recording material according to claim 2, wherein the diazonium salt compounds represented by the general formula (II) have melting points within a range from 30° C. to 200° C.

9. The heat-sensitive recording material according to claim 1, wherein the diazonium salt compounds represented by the general formula (I) have water-solubility of no greater than 1% by weight.

10. The heat-sensitive recording material according to claim 2, wherein the diazonium salt compound represented by the general formula (II) has a water-solubility of no greater than 1% by weight.

11. The heat-sensitive recording material according to claim 1, wherein the diazonium salt compounds represented by the general formula (I) are used in a total amount of 0.02 to 3 g/m² in the heat-sensitive recording layer.

12. The heat-sensitive recording material according to claim 1, wherein the diazonium salt compounds represented by the general formula (I) are used in a total amount of 0.1 to 2 g/m² in the heat-sensitive recording layer.

13. The heat-sensitive recording material according to claim 1, wherein a content of each of the diazonium salt compounds is at least 5% by weight based on the total amount of the diazonium salt compounds represented by the general formula (I).

14. The heat-sensitive recording material according to claim 1, wherein a content of each of the diazonium salt compounds is at least 15% by weight.

15. The heat-sensitive recording material according to claim 2, wherein the diazonium salt compound represented by the general formula (II) and at least three diazonium salt compounds represented by the general formula (I) other than said diazonium salt compound represented by the general formula (II), are contained, and a content of the diazonium salt compound represented by the general formula (II) is from 20 to 50% by weight based on a total amount of the diazonium salts represented by the general formula (I).

* * * * *